(12) United States Patent
Kitano (10) Patent No.: US 11,081,467 B2
(45) Date of Patent: Aug. 3, 2021

(54) APPARATUSES AND METHODS FOR ARRANGING THROUGH-SILICON VIAS AND PADS IN A SEMICONDUCTOR DEVICE

(71) Applicant: MICRON TECHNOLOGY, INC., Boise, ID (US)

(72) Inventor: Tomohiro Kitano, Shibuya-ku (JP)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 16/235,645

(22) Filed: Dec. 28, 2018

(65) Prior Publication Data

US 2020/0212008 A1    Jul. 2, 2020

(51) Int. Cl.
| | |
|---|---|
| H01L 25/065 | (2006.01) |
| H01L 21/66 | (2006.01) |
| H01L 23/48 | (2006.01) |
| H01L 23/532 | (2006.01) |
| H01L 23/00 | (2006.01) |
| H01L 21/768 | (2006.01) |
| H01L 25/00 | (2006.01) |

(52) U.S. Cl.
CPC .... *H01L 25/0657* (2013.01); *H01L 21/76898* (2013.01); *H01L 22/32* (2013.01); *H01L 23/481* (2013.01); *H01L 23/53228* (2013.01); *H01L 24/05* (2013.01); *H01L 25/50* (2013.01); *H01L 2224/04042* (2013.01); *H01L 2224/05012* (2013.01); *H01L 2225/0651* (2013.01); *H01L 2225/06541* (2013.01); *H01L 2225/06562* (2013.01); *H01L 2225/06596* (2013.01); *H01L 2924/14361* (2013.01)

(58) Field of Classification Search
CPC ............... H01L 23/481; H01L 25/0657; H01L 21/76898; H01L 25/50; H01L 2225/06541; H01L 2924/00014; H01L 21/76805; H01L 2225/06513; H01L 2224/08145; H01L 2224/8203
USPC .......... 438/107, 667, 109; 257/773, E23.011
See application file for complete search history.

(56) References Cited

U.S. PATENT DOCUMENTS

| | | | |
|---|---|---|---|
| 9,543,257 B2 * | 1/2017 | Tsai | ................. H01L 23/481 |
| 9,666,520 B2 * | 5/2017 | Yu | ..................... H01L 23/481 |
| 2011/0133339 A1 * | 6/2011 | Wang | ............ H01L 21/76898 257/773 |
| 2015/0318267 A1 * | 11/2015 | Yu | ................. H01L 21/0214 257/774 |
| 2016/0225731 A1 * | 8/2016 | Chandolu | ............ H01L 25/50 |

* cited by examiner

*Primary Examiner* — Jonathan Han
(74) *Attorney, Agent, or Firm* — Dorsey & Whitney LLP (57) ABSTRACT

A semiconductor device may include a bond pad/probe pad pair that includes a bond pad and a probe pad positioned to be adjacent to each other to form an L shape. The device may also include a through-silicon via (TSV) pad positioned to be at least partially or entirely inside the recess area of the L shape. The bond pad and the probe pad may each have an opening, and at least a portion of the opening of the bond pad may extend into a portion of the opening of the probe pad. The arrangement of the bond pad, the probe pad and the TSV may be implemented in a wafer-on-wafer (WOW) that includes multiple stacked wafers. A method of fabricating the TSV may include etching the stacked wafers to form a TSV opening that extends through the multiple wafers, and filling the TSV opening with conductive material.

14 Claims, 5 Drawing Sheets

APPARATUSES AND METHODS FOR ARRANGING THROUGH-SILICON VIAS AND PADS IN A SEMICONDUCTOR DEVICE

BACKGROUND

New generation semiconductor technologies require smaller die size, higher speed and lower power consumption in a chip. For example, new generation packaging technologies allow the bond pad size to be smaller to reduce the die size. Stacked chips are used to realize dynamic random access memory (DRAM) to have a larger capacity in a smaller package. In stacked semiconductor chips, or wafer-on-wafer (WOW) chips, technologies also make it possible to reduce the size of through-silicon via (TSV).

New semiconductor technologies and chip requirement also face challenges. For example, a probe pad for testing memory at wafer level may be required. In this case, a TSV that is electrically coupled to circuitry underneath the bond pad will be at a distance from the bond pad, causing the die area to become larger. Further, the extent that the size of a probe pad can be reduced is limited because it is difficult to make the probe size of the probe card smaller and the size of the probe pad is required to be of sufficiently certain size because of the variation of the size due to a temperature change. These challenges may present a need in improved arrangement of TSV and pad layout.

BRIEF DESCRIPTION OF THE DRAWINGS

The present solution will be described with reference to the following figures, in which like numerals represent like items throughout the figures.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
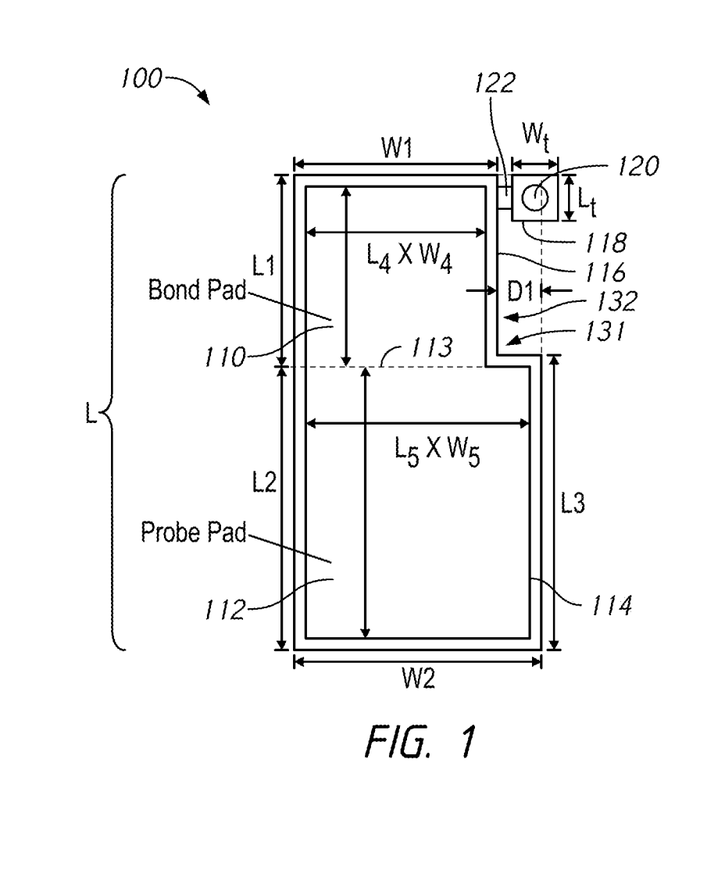
FIGS. 1-3 illustrate examples of various layouts of TSV pads, bond pads and probe pads in accordance with examples described herein.

In FIG. 1, a semiconductor device 100 may include a bond pad/probe pad pair in accordance with examples described herein. In some embodiments of the disclosure, the semiconductor device 100 may be a memory (e.g., LPDDR memory). A bond pad/probe pad pair may include a bond pad, e.g., 110 and a probe pad, e.g., 112 arranged to be adjacent to each other. A probe pad may be electrically coupled to the bond pad. The probe pad may be coupled to a probe card with a pin or needle. When the probe card is contacting the probe pad, electrical signals may be sent to or received from the probe pad to facilitate wafer-level testing of electrical characteristics of the semiconductor device. In some examples, the bond pad may be an aluminum pad that includes, for example, doped aluminum, aluminum alloys, or pure aluminum. In some examples, the probe pad may include similar materials as the bond pad. Additionally, and/or alternatively, the probe pad may include doped aluminum to control or limit damage caused by probing in performing a test.

In some examples, the bond pad and the probe pad may be arranged to be adjacent to each other to form an L shape. In some examples, the probe pad 112 may have a rectangular shape having dimensions L2×W2, where L2 is the dimension along a first side and W2 is the dimension along a second side. The bond pad 110 may have a rectangular shape having dimensions L1×W1, where L1 is the dimension along a first side and W1 is the dimension along a second side. In some examples, the bond pad 110 may be in a square shape, in which case L1=W1. The probe pad 112 may also be in a square shape, in which case L2=W2.

The bond pad 110 may be positioned to be adjacent (e.g., proximate) to the second side of the probe pad 112. In some examples, the dimensions of the bond pad 110 and the probe pad 112 may be different, thus an L shape is formed. For example, the second side of the probe pad 112 may be at least partially overlapped with a side of the bond pad 110 adjacent to the probe pad, where the dimension W1 of the overlapped side of the bond pad is smaller than the dimension W2 of the overlapped side of the probe pad. Consequently, a recess area 132 is formed by an inner angle 131 of the L shape. The recess area 132 is at least partially defined by the inner angle 131. In the example of FIG. 1, the recess area 132 is shown as having dimensions of L1×D1, where the lateral side D1=W2−W1.

In some scenarios, the semiconductor device 100 may have one or more TSV pads to transfer signals between electrical components. For example, in a WOW semiconductor, the TSV pads may be extended through multiple substrate layers in multiple stacked chips and transfer signals between the multiple chips. With reference to FIG. 1, a TSV pad 118 may be arranged to overlap with the recess area 132. Depending on the size of the recess area 132 of the L shape, the TSV pad 118 may be arranged partially or entirely inside the recess area 132. As a result, the overall size of the layout that includes the bond pad, the probe pad and the TSV in the semiconductor device may be reduced in comparison to a TSV not arranged inside the recess area 132.

In some scenarios, the bond pad 110 and the probe pad 112 may each have an opening. In an example, the dimensions L4×W4 of the opening of the bond pad are 40×40 μm. The dimensions L5×W5 of the opening of the probe pad are 61×51 μm. If a side of the bond pad 110 and the first side of the probe pad 112 are aligned when the two pads are arranged to be adjacent to each other, a dimension D1 of a lateral side of the L-shape will be about 11 um, which is the difference between the dimension W1 of the bond pad 110 and the dimension W2 of the probe pad 112. In some examples, for example, as shown in FIG. 1, the bond pad 110 and probe pad 112 are adjoining so that the opening of the bond pad 110 and the opening of the probe pad 112 meet at a shared boundary 113 in between. In such case, at least a portion of the opening of the probe pad 112 transitions continuously into the opening of the bond pad 110; and similarly, at least a portion of the opening of the bond pad transitions continuously into the opening of the probe pad.

In the example in FIG. 1, the TSV pad 118 may be arranged in a proximity of the bond pad but not to be in contact with the bond pad. In some examples, the TSV may be at a distance of 4-6 μm from the bond pad. The TSV pad may be coupled to the bond pad 110 by metal layer 122. As previously described, the TSV pad may be partially or entirely inside (e.g., overlapped) the recess area 132. For example, if the TSV pad 118 is at a distance of 4-6 μm from the bond pad 110 and the dimensions of the TSV pad Lt×Wt are 11×11 μm, then the TSV pad will be partially overlapped with the recess area 132.

In some scenarios, in fabricating the semiconductor device, the opening of the bond pad 110 and the opening of the probe pad 112 may be formed together into one larger L-shaped opening area 114 with a boundary 116. Traditionally, when the bond pad and the probe pad are physically separate pads, an extra metal layer, e.g., a redistribution layer (iRDL) may be coupled to both pads to allow the bond pads of the die to be available for bonding out other locations such as bump pads. In some examples, an iRDL layer may be coupled to the bond pad 110 and the probe pad 112 to reduce power dissipation and heating issues associated with power distribution. In some examples, the iRDL layer may include low resistivity lines that provide power to certain locations within the device. In comparison, when the opening of the bond pad and the opening of the probe pad are formed together, no iRDL layer is required. Consequently, the overall layout size of the semiconductor device is reduced. In some examples, an upper metal layer may be arranged on top of the opening area 114 having the boundary 116. The boundary 116 of the upper metal layer may cover the opening area 114 and also extend beyond the opening area to surround the border of the opening area. A cover film, such as a polyimide film, may be disposed in the area between the border of the opening area 114 and the boundary 116 of the metal pad. The bond pad 110 and the probe pad 112 may also share the same metal layer and the same passivation layer. A TSV opening 120 may be in electrical contact with the metal layer 122 to transfer signals to/from circuitry coupled to the bond pad 110 in the semiconductor device 100.

Figure 2:
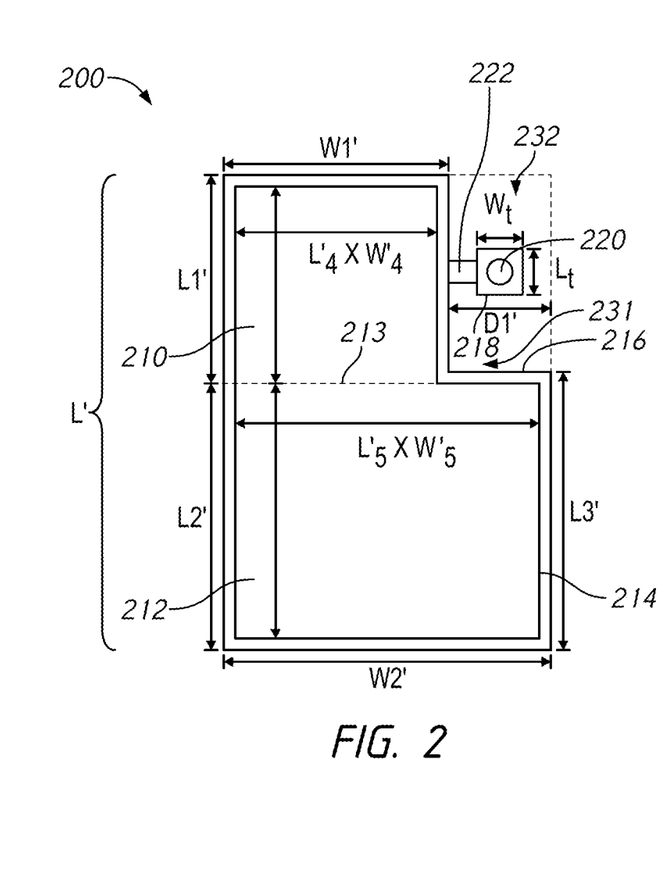

In FIG. 2, a semiconductor device 200 may include a bond pad/probe pad pair in accordance with examples described herein. In some embodiments of the disclosure, the semiconductor device 200 may be a memory (e.g., LPDDR memory). A bond pad/probe pad pair may include a bond pad 210 and a probe pad 212 arranged to be adjacent to each other. FIG. 2 illustrates a variation of the layout in FIG. 1. In some examples, a semiconductor device 200 may include a bond pad 210 and a probe pad 212 arranged to form an L shape. In some examples, the probe pad 212 may have a rectangular shape having dimensions L2'×W2', where L2' is the dimension along a first side and W2' is the dimension along a second side. The bond pad 210 may have a rectangular shape having dimensions L1'×W1', where L1' is the dimension along a first side and W 1' is the dimension along a second side. In some examples, the bond pad may be in a square shape, in which case L1'=W W1'. The probe pad may also be in a square shape, in which case L2'=W2'.

In the example in FIG. 2, the bond pad 210 may be arranged to be adjacent (e.g., proximate) to the second side of the probe pad 212. The second side of the probe pad 212 may be at least partially overlapped with a side of the bond pad 210 adjacent to the probe pad, where the dimension W1' of the overlapped side of the bond pad is smaller than the dimension W2' of the overlapped side of the probe pad. Consequently, a recess area 232 is formed by an inner angle 231 of the L shape. The recess area 232 is at least partially defined by the inner angle 231. In the example of FIG. 2, the recess area 232 is shown as having dimensions of L1'×D', where the lateral side D 1'=W2'-W 1'.

In comparison to FIG. 1, the difference D1' between the dimension W1' of the bond pad 210 and the dimension W2' of the probe pad 212 is larger, forming an increased recess area for the L shape 232. In a non-limiting example, if an opening of the bond pad 210 has dimensions L4'×W4' of 40×40 μm, an opening of the probe pad 212 has dimensions L5'×W5' of 61×51 μm, then the recess area 232 formed by the inner angle 231 of the L shape may be L1'×(W2'-W1'), that is, 40×21 μm. In some examples, for example, as shown in FIG. 2, the bond pad 210 and probe pad 212 are adjoining so that the opening of the bond pad 210 and the opening of the probe pad 212 meet at a shared boundary 213 in between. In such case, at least a portion of the opening of the probe pad transitions continuously into the opening of the bond pad; and similarly, at least a portion of the opening of the bond pad transitions continuously into the opening of the probe pad.

The dimensions of a TSV pad 218 may be the same as the previous example in FIG. 1, e.g., 11×11 μm, with an opening 220 having a diameter of 5 μm. Similar to the example in FIG. 1, the TSV pad 218 may be arranged in a proximity of the bond pad but not to be in contact with the bond pad. For example, the TSV pad 218 may be at a distance of 4-6 μm from the bond pad 210. In such case, the TSV pad 218 may be arranged to be entirely inside the recess area 232 of the L shape.

In some scenarios, in fabricating the semiconductor device, the dimensions L4'×W4' of the opening of the bond pad and the dimensions L5'×W5' of the opening of the probe pad L5'× W5' may be formed together into one larger L-shaped opening area 214 with the boundary 216. When the opening of the bond pad 210 and the opening of the probe pad 212 are formed together, no iRDL layer is required. In some examples, an upper metal layer may be arranged on top of the opening area 214 having the boundary 216. The boundary 216 of the upper metal layer may cover the opening area 214 and also extend beyond the opening area to surround the border of the opening area. A cover film, such as a polyimide film, may be disposed in the area between the border of the opening area 214 and the border 216 of the metal pad. The bond pad 210 and the probe pad 212 may also share the same metal layer and the same passivation layer. The TSV opening 220 may be in electrical contact with a metal layer 222 to transfer signals to/from circuitry coupled to the bond pad 210 in the semiconductor device 200.

Figure 3:
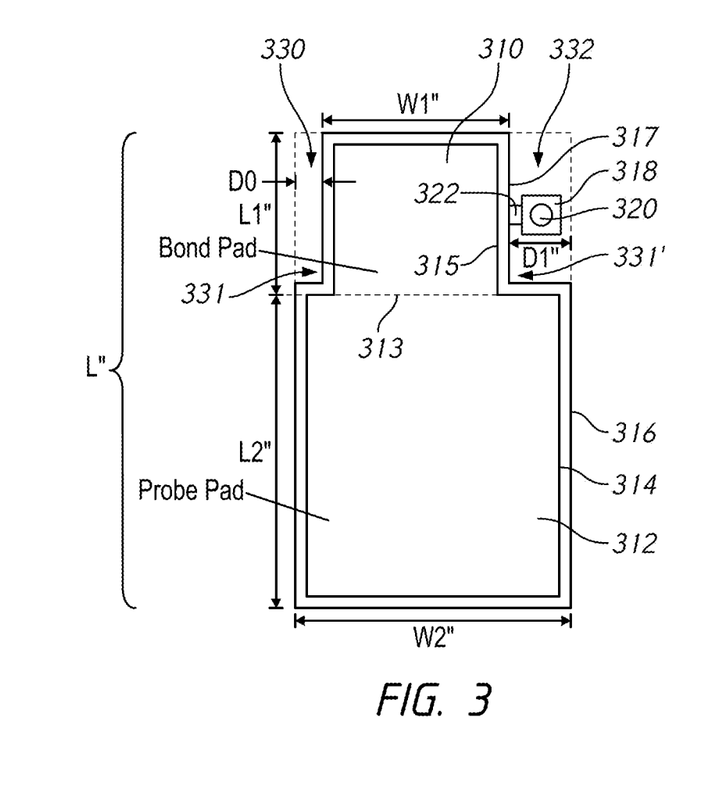

FIG. 3 illustrates another variation of the layout in FIG. 1 in accordance with some examples described herein. In some embodiments of the disclosure, the semiconductor device 300 may be a memory (e.g., LPDDR memory). The semiconductor device 300 may include a bond pad/probe pad pair, in which a bond pad 310 and a probe pad 312 are arranged to be adjacent to each other. In some examples, the bond pad 310 and the probe pad 312 may form two L shapes. For example, the probe pad 312 may have a dimension that is measured, by the metal layer area 316, L2"×W2", where L2" is the dimension along a first side and W2" is the dimension along a second side. The bond pad 310 may have a dimension that is measured, by the metal layer area 317, L1"×W1", where L1" is the dimension along a first side and W1" is the dimension along a second side. In some examples, the bond pad may be in a square shape, in which case L1"=W1". The probe pad may also be in a square shape, in which case L2"=W2". In the example in FIG. 3, the bond pad 310 may be arranged to be adjacent to the probe pad 312, so that a side of the bond pad is aligned with a side of the probe pad, where the side of the bond pad is centered along the side of the probe side to which the bond pad is adjacent. In such case, two L shapes will be formed, one on each side of the probe pad, such as shown in the recess areas 330 and 332. Each recess area is at least partially defined by the inner angle 331 and 331' of the respective L shapes. In such case, the dimensions of the lateral sides $D_0$ and $D1"$ of the respective recess areas 330, 320 may be the same. In some examples, the bond pad 310 does not need to be centered along the side of the probe pad and still form two L shapes. In such case, the dimensions of the lateral sides $D_0$ and $D1"$ of the respective recess areas 330, 320 may be different.

Similar to FIGS. 1 and 2, the difference between the size of the bond pad and the probe pad may allow a TSV pad to be placed partially or entirely in the recess area at least partially defined by the inner angle of the L shape. If the difference between the size of the bond pad and that of the probe pad is large enough, each of the L shapes may cover one or more TSV pads partially or entirely. For example, in FIG. 3, the TSV pad 318 with the opening of 320 is placed entirely in the recess area 332 of the L shape. When the TSV pad is partially or entirely inside the recess area of the L-shape, the overall layout size is reduced in comparison to a TSV pad not being placed in the recess area of the L-shape. Although not shown, one or more TSV pads may also be placed in the recess area of the other L shape, such as area 330. Further, although FIG. 3 is shown to have the bond pad arranged to be adjacent to the second side of the probe pad, other arrangement may be possible. For example, the bond pad may be arranged to be adjacent to the first side of the probe pad.

In some examples, for example, as shown in FIG. 3, the bond pad 310 and probe pad 312 are adjoining so that the opening of the bond pad 310 and the opening of the probe pad 312 meet at a shared boundary 313 in between. In such case, at least a portion of the opening of the probe pad transitions continuously into the opening of the bond pad; and similarly, at least a portion of the opening of the bond pad transitions continuously into the opening of the probe pad.

In some scenarios, in fabricating the semiconductor device, the opening of the bond pad 315 and the opening of the probe pad 314 may be formed together into one larger T-shaped opening with the boundary 316, 317. When the opening of the bond pad and the opening of the probe pad are formed together, no iRDL space is required. Consequently, the overall layout size of the semiconductor device is reduced. In some examples, an upper metal layer may be arranged on top of the opening area 314, 315 having the boundary 316, 317. The boundary 316, 317 of the upper metal layer may cover the opening area 314, 315 and also extend beyond the opening area to surround the border of the opening area. A cover film, such as a polyimide film, may be disposed between the border of the opening area 314, 315 and the border of the metal pad 316, 317. The bond pad 310 and the probe pad 312 may also share the same metal layer and the same passivation layer. The TSV opening 320 may be in electrical contact with a metal layer 322 to transfer signals to/from circuitry coupled to the bond pad in the semiconductor device 300.

Figure 4:
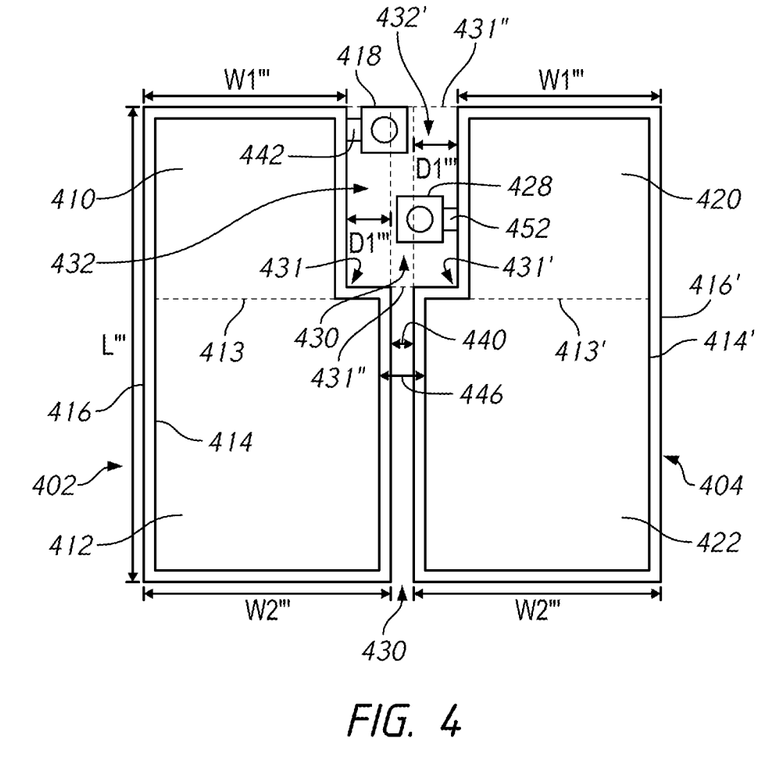
FIG. 4 illustrates an example of layout of TSV pads, bond pads and probe pads in accordance with examples described herein.

FIG. 4 illustrates another variation of the layout of FIG. 1, where a semiconductor device 400 may include two bond pad/probe pad pairs that are positioned relative to each other. In some examples, the semiconductor may include an LPDDR memory. Each pair may include a bond pad and a probe pad arranged to be adjacent to each other. For example, each bond pad/probe pad may form an L shape (such as shown in FIGS. 1-3) and the openings of the L shapes of the two pairs are facing each other. For example, bond pad 410 and probe pad 412 in a first bond pad/probe pad pair are arranged to form an L shape in the manner described in FIGS. 1 and 2. Similarly, bond pad 420 and probe pad 422 in a second bond pad/probe pad pair are also arranged in the same manner to form an L shape. Each of the L-shapes forms a recess area, 432, 432' that is at least partially defined by its respective inner angle, such as 431 and 431'. In a non-limiting example in FIG. 4, the openings/recess areas of the two L shapes are facing each other so that the two recess areas 432 and 432' are joined to form a larger joint recess area 431". In the current example, two TSV pads 418, 428 are placed in the joint recess area 431", where each TSV pad is in electrical contact with circuitry coupled to a respective bond pad. For example, TSV pad 418 may be connected to the bond pad 410, such as via a metal layer 442. TSV pad 428 may also be connected to the bond pad 420 via a metal layer 452.

In some examples, a first bond pad/probe pad pair 402 formed by a first pair of bond pad 410 and probe pad 412 is placed adjacent to a second bond pad/probe pad pair 404 formed by a second pair of bond pad 420 and probe pad 422. In a non-limiting example, bond pad/probe pad pairs 402, 404 each have an L shape forming a recess area 432, 432' defined by the inner angle of the respective L shape. The recess area may have a long side and a lateral side, such as $D1'''$. In a non-limiting example, the two bond pad/probe pad pairs 402 and 404 are arranged to be adjacent to each other so that the long sides of the recess areas of the L shapes are facing each other. As shown in FIG. 4, a TSV pad, e.g., 418 may be in electrical contact with a metal layer 442 coupled to the bond pad 410 and at least partially inside the recess area 432 in the same manner described in FIG. 1. Similarly, the TSV pad 428 may be connected to a metal layer 452 coupled to the bond pad 420 and at least partially inside the recess area 432'. When the pad pairs 402 and 404 are placed with the recess areas of the L shapes facing each other, a joint recess area 431" is formed, which combines the recess area of each respective L shape 431 and 431'. Further, the joint recess area 431" may also include additional spacing 430 between the two pad pairs 402 and 404. In some examples, a minimal size of the spacing 430 depends on the minimal spacing 440 between the two pads, which may depend on the iRDL spacing. In some examples, the iRDL spacing may be at least 4 μm. The spacing 430 may also depend on the spacing requirement between the two openings of the probe pads, which is based on the cover film, such as polyimide. In a non-limiting example, the minimal spacing between the openings of the two probe pads may be at least 10 μm. Comparing the current example with FIG. 1, when two pad pairs 402 and 404 are placed in the manner described in FIG. 4, the joint recess area is expanded by the additional spacing, such as spacing 430. This allows the TSV pad to be placed entirely inside the joint recess area, while the TSV pad would be only partially inside the recess area of one L shape of a single bond pad/probe pad pair, such as shown in FIG. 1.

In some scenarios, in each bond pad/probe pad pair, e.g., 402, the bond pad 410 and the probe pad 412 in the pad pair may be adjoining so that the opening of the bond pad 410 and the opening of the probe pad 412 meet at a shared boundary 413 in between. In this case, at least a portion of the opening of the probe pad transitions continuously into the opening of the bond pad; and similarly, at least a portion of the opening of the bond pad transitions continuously into the opening of the probe pad. Similarly, in bond pad/probe pad pair 404, the bond pad 420 and the probe pad 422 in the pad pair may be adjoining so that the opening of the bond pad 420 and the opening of the probe pad 422 meet at a shared boundary 413' in between. In this case, at least a portion of the opening of the probe pad transitions continuously into the opening of the bond pad; and similarly, at least a portion of the opening of the bond pad transitions continuously into the opening of the probe pad.

In some examples, in fabricating the semiconductor device, in one or both of the bond pad/probe pad pairs 402, 404, the opening of the bond pad and the opening of the probe pad may be formed together into one larger L-shaped opening area. When the opening of the bond pad and the opening of the probe pad are formed together, no iRDL layer is required in between. In some examples, an upper metal layer may be arranged on top of the opening area of each pad 402, 404, in a similar as described in FIGS. 1-3. A cover film, such as a polyimide film, may be disposed in the area between the border of the opening area and the border of the metal pad, such as between 414 and 416, or between 414' and 416'. The bond pad and the probe pad in each pad pair 402, 404 may also share the same metal layer and the same passivation layer. Several arrangements of TSVs in a semiconductor are illustrated in FIGS. 1-4 only by way of examples. However, variations may also be possible. For example, there may be various ways the bond pad and the probe pad can be arranged to be adjacent to each other either by the first side or by the second side to form an L shape or a T shape, to accommodate space for arranging one or more TSVs.

Figure 5A:
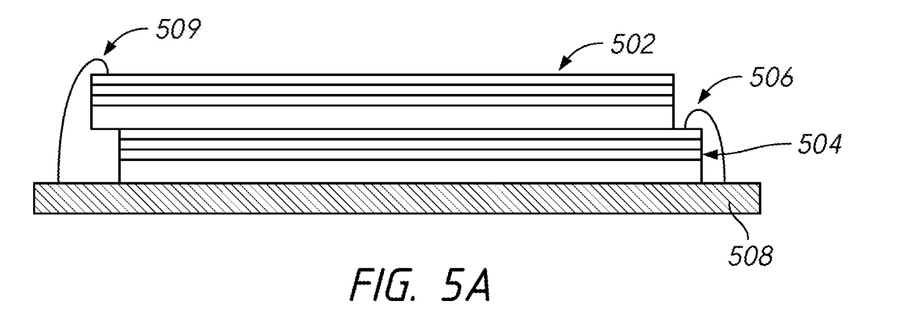
FIGS. 5A-5E illustrate examples of various cross-section diagrams illustrating the forming of a TSV in a stacked chip configuration in accordance with examples described herein.

FIGS. 5A-5E illustrate examples of various cross-section diagrams illustrating the TSV arrangement and forming of a TSV in a stacked chip configuration in accordance with examples described herein. For example, FIG. 5A illustrates an example of a 2×WOW semiconductor, where two WOW chips 502 and 504 are stacked. In this example, each of the WOW chips has multiple wafers stacked, and each WOW chip includes multiple bond pads. For example, the WOW chip 504 may include an exposed area 506 on which multiple bond pads may be arranged to extend wires therefrom and connect to other circuitry components 508, such as a PCB. The WOW chip 502 may also include an area 509 on which bond pads are placed to extend wires to connect with the other circuitry components 508. In some examples, the WOW chips 502, 504 may include an LPDDR memory, and may additionally include probe pads adjacent to the bond pads. Further, each WOW chip 502, 504 may also include one or more TSVs that extend through multiple wafers in each WOW chip. The bond pads, the probe pads and TSVs may be arranged in accordance with various embodiments in FIGS. 1-4.

Figure 5B:
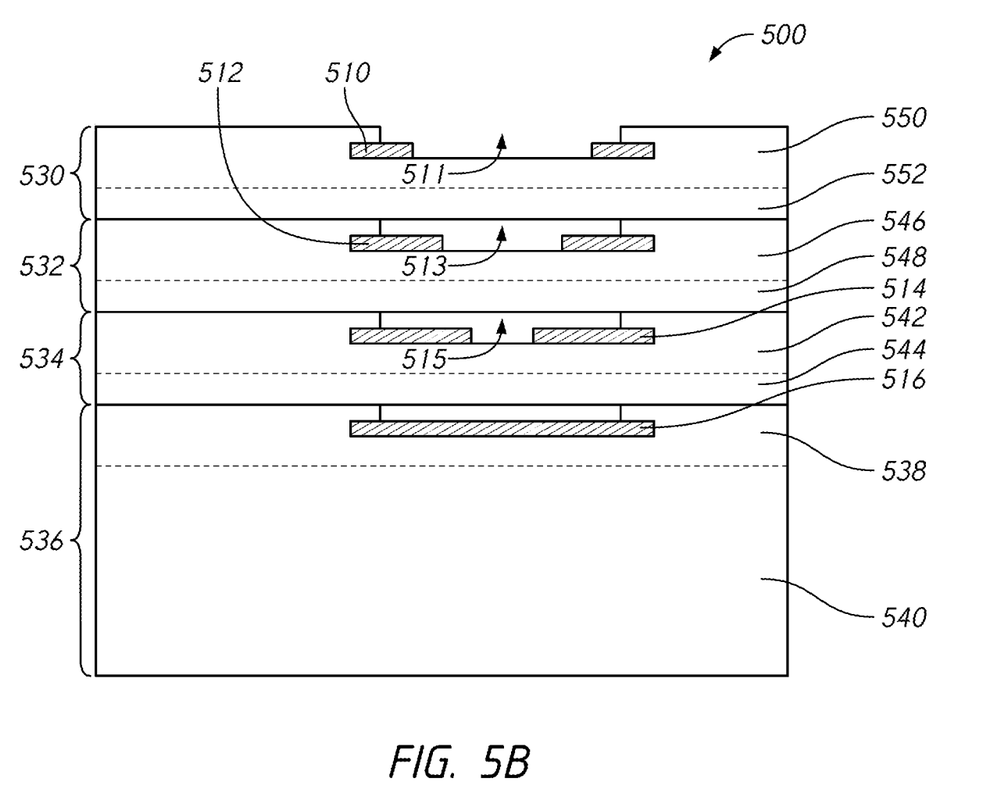
Figure 5C:
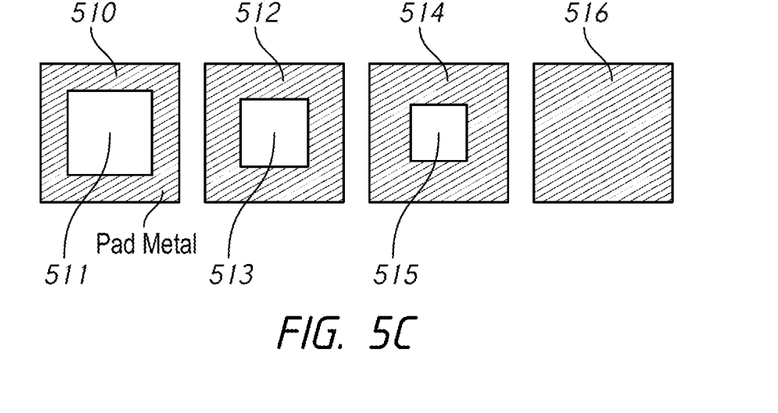
Figure 5D:
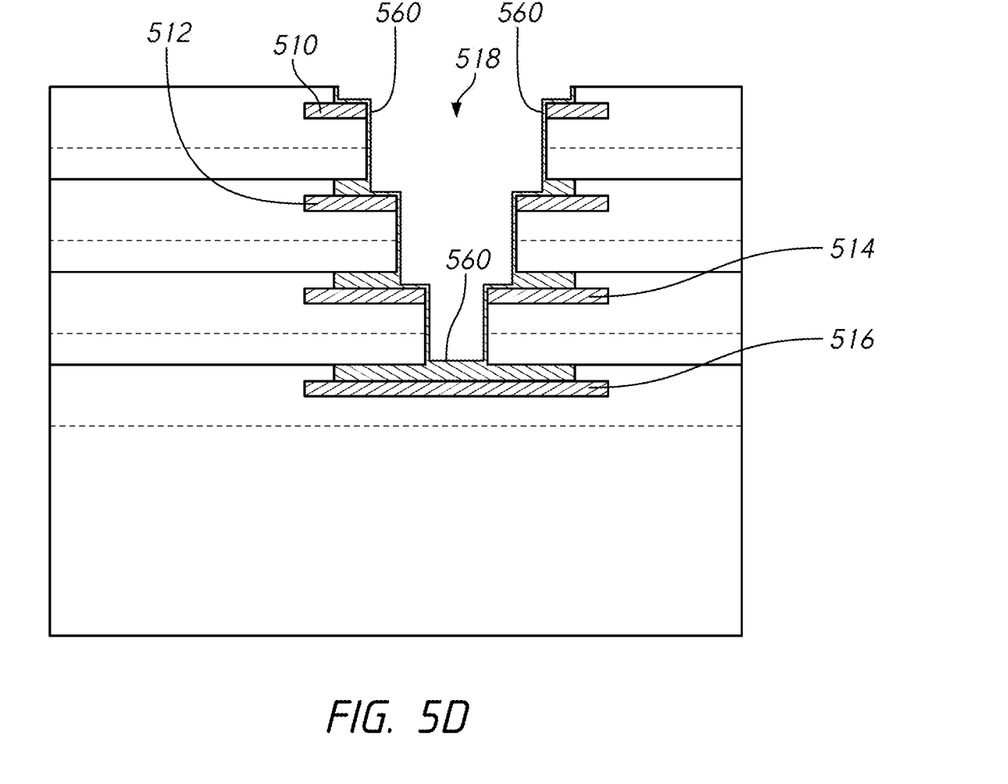
Figure 5E:
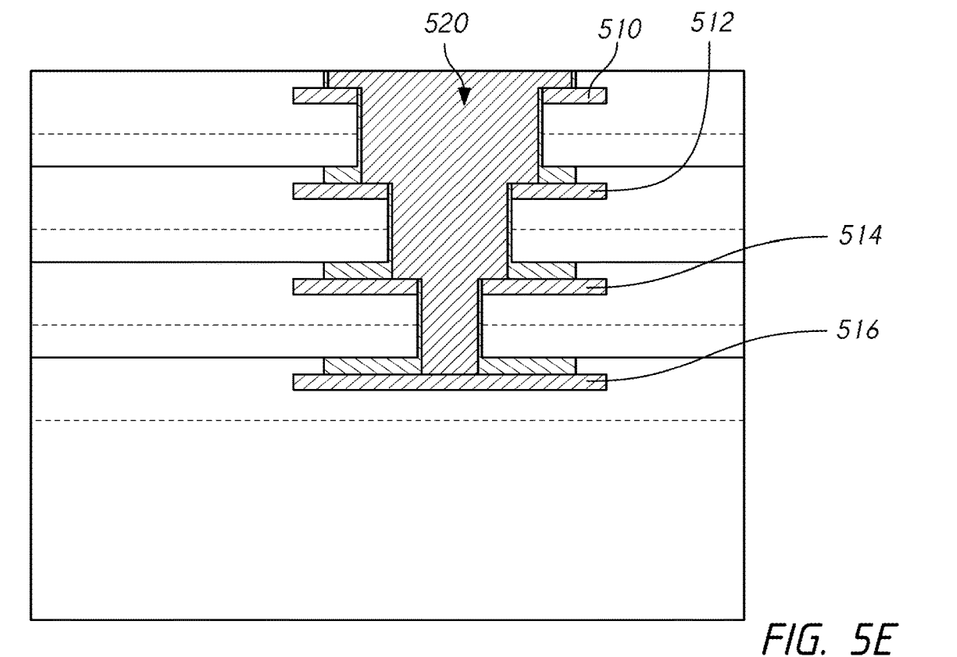

FIGS. 5B, 5D and 5E illustrate cross-section diagrams illustrating a TSV that extends through multiple wafers in a WOW chip 500. Although bond pads and probe pads are not shown, the TSV may be arranged adjacent to a bond pad in the area 506, 509 in FIG. 5A in accordance with various embodiments in FIGS. 1-4. In FIG. 5B, in some examples, a WOW chip may include multiple wafers stacked on top of each other. For example, WOW chip 500 may include a base wafer 536. The base wafer 536 may include a substrate 540 and a wiring structure 538 disposed on the substrate 540. In some examples, the substrate 540 may include electrical connections (including vertical electrical connections), contacts, circuitry, or the like. In some embodiments, the substrate 540 may be a wafer (e.g., a silicon wafer) with logic circuitry, light-emitting diodes (LED) driver circuitry, and/or application-specific integrated circuits (ASIC). The substrate 540 may be part of a singulated device (e.g., a die, a chip, a memory device, etc.), microelectronic structure, or the like. The wiring structure 538 may include one or more metal layers, such as metal layer 516 which may be configured to connect to the other wafers in the WOW chip to transfer signals to/from the other wafers.

In some examples, the WOW chip 500 may include additional wafers, such as 534, 532, 530 that are stacked on the base wafer 536. For example, a second wafer 534 may be disposed on the base wafer 536. In some examples, the second wafer 534 may include a substrate 544 and a wiring structure 542 disposed on the substrate. The wiring structure 542 may include a metal layer 514 that may be configured to connect to the other wafers in the WOW chip 500. A third wafer 532 may be stacked on the second wafer 534. Similar to the second wafer 534, the third wafer 532 may include a substrate 548 and a wiring structure 546 disposed on the substrate 548. The wiring structure 546 may also include a metal layer 512 for connecting to the other wafers in the WOW chip 500. A fourth wafer 530 may be stacked on the third wafer 532. The fourth wafer 530 may include a substrate 552 and a wiring structure 550 disposed on the substrate 552. The wiring structure 550 may also include a metal layer 510 for connecting to the other wafers in the WOW chip 500. Although four wafers are shown in FIG. 5B, other configurations are also possible. For example, eight wafers may also be stacked in a similar manner.

In forming a TSV that extends through multiple wafers in a WOW chip 500, in some examples, one or more of the metal layers in respective wafers may have an opening. The opening in a metal layer in a given wafer may have various sizes. For example, the metal layer 516 at the base wafer 536 may be a solid pad metal, such as shown in FIG. 5C. In FIG. 5C, the metal layers 510, 512, 514 each may be a pad metal having an opening, such as 511, 513, 515. In some scenarios, the openings of pad metal in different wafers in the WOW chip may have variable sizes. For example, from the second wafer 534 to the fourth (top) wafer 530 in FIG. 5B, the opening in the TSV pad metal may have an increasing size, e.g., in width, as shown in openings 515, 513 and 511. It is appreciated that the pad metal 510, 512, 514, 516 for different wafers may have a square shape (as shown), a round shape, a square shape with round corners, or oblong shapes (e.g., rectangles), or other suitable shapes. The shape of the openings of the pad metal may also vary.

Returning to FIG. 5B, the openings of various sizes in different wafers will facilitate easy fabrication of the TSV. This is further explained with reference to FIGS. 5D and 5E. In some examples, with reference to FIG. 5D, an etching process may be used to etch the stacked structure. Any suitable known or later developed etching process may be used. The etching process may etch away the materials underneath the opening of the pad metal such as 510, 512 and 514, and an opening 518 is formed to the wiring structure 538 of the base wafer 536 in accordance with the openings in each wafer. Because the sizes of the openings in the stack decrease, the width of the etched opening 518 of the TSV also decreases as the opening extends closer to the base wafer 536, to form a funnel shape with the opening at a top wider than the opening at a bottom. Additionally, an insulating film 560 may be formed over a portion of a surface of the opening 518. Further, the insulating film 560 is removed from surfaces of the pad metal 510, 512 and 514 to expose portions of the respective pad metal using an etch-back process, and the opening 518 may be filled with conductive materials e.g., conductive material 520, as shown in FIG. 5E, to form the TSV.

Figure 6:
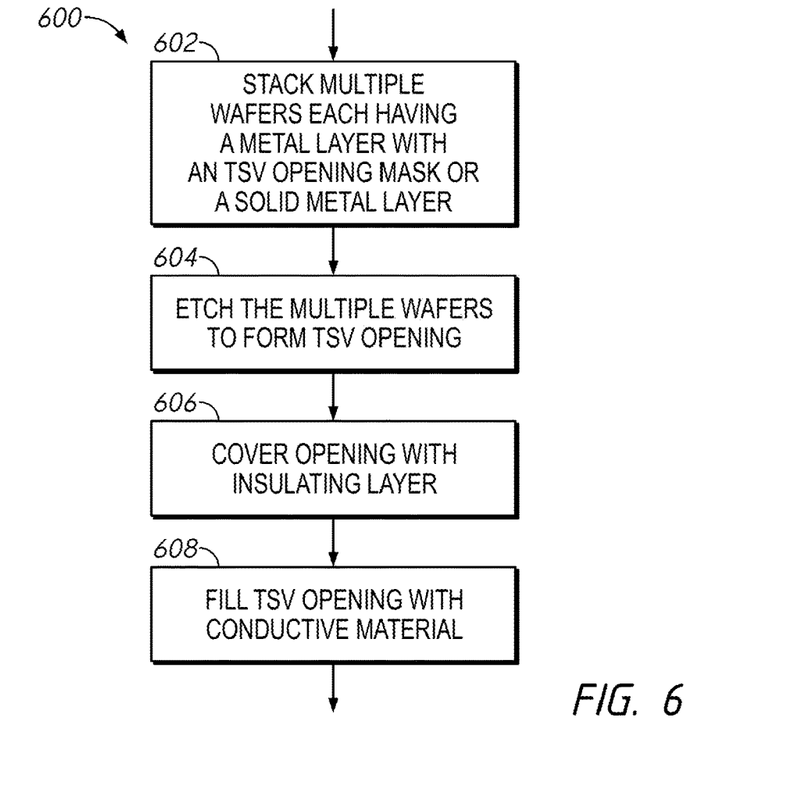
FIG. 6 is an example of a process of forming a TSV in a stacked chip configuration in accordance with examples described herein.

With reference to FIG. 6, an example process 600 for forming a TSV that extends through multiple wafers in a WOW chip may include stacking multiple wafers (e.g., 530, 532, 534, 536 in FIG. 5A) at 602. Each of the wafers in the WOW chip may include a metal layer (e.g., 510, 512, 514, 516) for forming a TSV. In some examples, the metal layer may include a pad metal. Each pad metal may be a solid pad metal (e.g., 516) or may include an opening (e.g., 510, 512, 514). The size of the opening for each wafer may vary. For example, as shown in FIG. 5B, the metal layer of the top wafer may have a larger opening than that of the metal layer of the wafer underneath.

The process 600 may further include etching the multiple wafers to form a TSV opening at 604. The extent to which the wafer materials will be etched may be based on the size of the opening of the pad metal at each wafer. When the openings of the pad metal in different wafers vary in size, the size of the etched opening in each wafer will vary accordingly. For example, when the sizes of the openings of the pad metal from the top to bottom wafer decrease, the etched opening will form a funnel shape with the opening on the top wider than the opening on the bottom, as shown in FIG. 5D.

Additionally, the process 600 may include covering the etched opening with an insulating layer at 606. For example, the process 600 may deposit an insulating film 560 over the surface of the opening 518. The insulating film may be made of dielectric materials, such as SiO2, or other suitable insulating materials. And then, a top surface portion of the insulating film on the pad metal of each wafer is removed using an etch-back process.

In some examples, the process 600 may further include filling the etched TSV opening with conductive materials at 608, e.g., conductive material 520 in FIG. 5E. For example, the process 600 may fill in the etched TSV opening with copper (Cu), or other conductive material. Once the conductive materials are filled in the TSV opening, the TSV is formed to be in electrical contact with the pad metal in each wafer, to facilitate conductive paths between the multiple wafers.

The various arrangement of TSVs and the process of forming the TSV described herein in FIGS. 1-6 provide advantages over existing memory devices in achieving reduced layout size, such as, in a WOW configuration with bond pads and probe pads. For example, forming the opening of the bond pad and the probe pad altogether eliminates the space needed for separate bond pad and probe pad disposed apart from one another. Further, the arrangement of bond pad and probe pad relative to each other may form an L shape, a recess area of which may include at least a portion of a TSV to reduce layout size. Further, two or more pairs of bond pad/probe pad may be arranged together to combine the multiple L shapes from each pair to form a larger L shape to facilitate even further reduction of layout size.

From the foregoing it will be appreciated that, although specific embodiments of the disclosure have been described herein for purposes of illustration, various modifications or combinations of various features may be made without deviating from the spirit and scope of the disclosure. For example, although some examples are described in the context of WOW chip, the descriptions in those examples may also be applicable to other bond pad configurations that include layout of TSVs. Further, the descriptions in the examples in this disclosure are not limited to any particular shapes and/or arrangements for the bond pad, the probe pad or the TSV pad, or materials for each, and any suitable shape, arrangement or materials are also possible. Accordingly, the disclosure is not limited except as by the appended claims.

What is claimed is:

1. A semiconductor device comprising:
    a first bond pad and a first probe pad sharing a same metal layer and each having a respective opening, the first bond pad and the first probe pad adjoining each other to form a first bond pad/probe pad pair, the first bond pad/probe pair defining a first L shape; and
    a first through-silicon via (TSV) pad positioned to be at least partially inside a recess area defined at least in part by an inner angle of the first L shape,
    wherein the opening of the first bond pad and the opening of the first probe pad meet at a shared boundary in between.

2. The semiconductor device of claim 1, wherein:
    the first bond pad and the first probe pad each have an opening; and
    at least a portion of the opening of the first bond pad transitions continuously into a portion of the opening of the first probe pad.

3. The semiconductor device of claim 2 further comprising an upper metal layer, wherein the upper metal layer:
    covers and extends beyond the opening of the first bond pad; and
    covers and extends beyond the opening of the first probe pad.

4. The semiconductor device of claim 3, wherein the the first bond pad and the first probe pad share a same passivation layer.

5. The semiconductor device of claim 1, where a side of the first bond pad and a side of the first probe pad are overlapped at least partially, and wherein a dimension of the overlapped side of the first bond pad is smaller than a dimension of the overlapped side of the first probe pad.

6. The semiconductor device of claim 5, where the first TSV pad is entirely inside the recess area of the first L shape.

7. The semiconductor device of claim 2, wherein:
    a first bond pad and the first probe pad are positioned to form an additional L shape; and
    the opening of the first bond pad and the opening of the first probe pad from a T shape.

8. The semiconductor device of claim 1 further comprising
    a second bond pad and a second probe pad positioned to be adjacent toe ach other to form a second bond pad/probe pad pair, the second bond pad/probe pair defining a second L shape; and
    a second TSV pad positioned to be at least partially inside a recess area defined at least in part by an inner angle of the second L shape;
    wherein the recess area defined by the inner angel of the first L shape and the recess area defined by the inner angle of the second L shape form a joint recess area in which the first TSV pad and the second TSV pad are placed.

9. The semiconductor device of claim 8, wherein the first bond pad/probe pad pair and the second bond pad/probe pad pair are positioned at a distance from each other.

10. The semiconductor device of claim 9, wherein:
    the first bond pad and the first probe pad each have an opening;
    the second bond pad and the second probe pad each have an opening; and
    at least:

at least a portion of the opening of the first bond pad transitions continuously into a portion of the opening of the first probe pad; or at least a portion of the opening of the second bond pad transitions continuously into a portion of the opening of the second probe pad.

11. A semiconductor device comprising:

a wafer-on-wafer (WOW) chip comprising a plurality of stacked wafers disposed on a base wafer;

at least bond pad and a probe pad disposed on a top of the plurality of stacked wafers, wherein the bond pad and the probe pad share a same metal layer and each have a respective opening, the first bond pad and the first probe pad adjoining each other to forma bond pad/probe pad pair, the bond pad/probe pair defining an L shape; and a through-silicon via (TSV) positioned to be at least partially inside a recess area defined by an inner angle of the L shape;

wherein the opening of the first bond pad and the opening of the first probe pad meet at is shared boundary in between.

12. The semiconductor device of claim 11, wherein:

the bond pad and the probe pad each have an opening; and the opening of the bond pad and the opening of the probe pad are formed together.

13. The semiconductor device of claim 11, wherein:

each of the plurality of stacked wafers comprises a pad metal having an opening; and the TSV extends through the plurality of stacked wafers, wherein a width of an opening of the TSV is limited by sizes of the openings of the pad metal in the plurality of stacked wafers.

14. The semiconductor device of claim 13, wherein:

the sizes of the openings of the pad metal in the plurality of stacked wafers decrease from the top to a bottom of the plurality of stacked wafers; and the TSV extending through the plurality of stacked wafers form a funnel shape with an opening at a top of the funnel shape wider than an opening at a bottom of the funnel shape.

* * * * *

UNITED STATES PATENT AND TRADEMARK OFFICE
CERTIFICATE OF CORRECTION

| | |
|---|---|
| PATENT NO. | : 11,081,467 B2 |
| APPLICATION NO. | : 16/235645 |
| DATED | : August 3, 2021 |
| INVENTOR(S) | : Tomohiro Kitano |

Page 1 of 2

It is certified that error appears in the above-identified patent and that said Letters Patent is hereby corrected as shown below:

In the Claims

| | Reads | Should Read |
|---|---|---|
| Column 10, Line 30, Claim 4 | "where in the the first bond pad" | -- wherein the first bond pad -- |
| Column 10, Line 33, Claim 5 | "where a side of the first bond pad" | -- wherein a side of the first bond pad -- |
| Column 10, Line 38, Claim 6 | "where the first TSV pad" | -- wherein the first TSV pad -- |
| Column 10, Line 41, Claim 7 | "a first bond pad" | -- the first bond pad -- |
| Column 10, Line 44, Claim 7 | "from a T shape" | -- form a T shape -- |
| Column 10, Line 48, Claim 8 | "adjacent toe ach other" | -- adjacent to each other -- |
| Column 10, Line 49, Claim 8 | "form a second bond pad/ probe pad pair, the second bond pad/probe pair" | -- form a second bond pad/probe pad pair, the second bond pad/ probe pad pair -- |
| Column 10, Line 54, Claim 8 | "defined by the inner angel" | -- defined by the inner angle -- |

Signed and Sealed this
Twenty-first Day of September, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)  Page 2 of 2
U.S. Pat. No. 11,081,467 B2

| | | |
|---|---|---|
| Column 10, Line 60, Claim 9 | "the second bond pad/probe pair" | -- the second bond pad/probe pad pair -- |
| Column 11, Line 9, Claim 11 | "at least bond pad and a probe pad" | -- at least a bond pad and a probe pad -- |
| Column 11, Line 14, Claim 11 | "forma bond pad" | -- form a bond pad -- |
| Column 11, Line 20, Claim 11 | "at is shared boundary" | -- at a shared boundary -- |